(12) United States Patent
Hamano et al.

(10) Patent No.: US 9,791,576 B2
(45) Date of Patent: Oct. 17, 2017

(54) SCINTILLATOR PANEL AND METHOD FOR MANUFACTURING SCINTILLATOR PANEL

(71) Applicant: Toray Industries, Inc., Chuo-ku, Tokyo (JP)

(72) Inventors: Tsubasa Hamano, Otsu (JP); Takahiro Tanino, Otsu (JP); Yuichiro Iguchi, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 14/646,500

(22) PCT Filed: Nov. 13, 2013

(86) PCT No.: PCT/JP2013/080650
§ 371 (c)(1),
(2) Date: May 21, 2015

(87) PCT Pub. No.: WO2014/080816
PCT Pub. Date: May 30, 2014

(65) Prior Publication Data
US 2015/0309189 A1 Oct. 29, 2015

(30) Foreign Application Priority Data
Nov. 26, 2012 (JP) .................. 2012-257209

(51) Int. Cl.
*G01T 1/20* (2006.01)
*G01T 1/202* (2006.01)
(Continued)

(52) U.S. Cl.
CPC ............ *G01T 1/2002* (2013.01); *G01T 1/202* (2013.01); *G01T 1/2018* (2013.01); *G03F 7/40* (2013.01); *G21K 2004/08* (2013.01)

(58) Field of Classification Search
CPC ..... G01T 1/2018; G01T 1/2002; G01T 1/202; H01L 27/14663; G03F 7/40
See application file for complete search history.

(56) References Cited

U.S. PATENT DOCUMENTS 6,043,604 A * 3/2000 Horiuchi ................... C03C 8/14
313/292
7,576,330 B1 * 8/2009 Lacey ....................... G01T 7/00
250/370.15

(Continued)

FOREIGN PATENT DOCUMENTS

EP 2905786 8/2015
EP 2922067 9/2015

(Continued)

OTHER PUBLICATIONS

Machine translation to English of JP 2011-021924A Feb. 3, 2011.*

(Continued)

*Primary Examiner* — Marcus Taningco
*Assistant Examiner* — Mindy Vu
(74) *Attorney, Agent, or Firm* — RatnerPrestia

(57) ABSTRACT

The present invention provides a scintillator panel which is provided with a narrow barrier rib with high accuracy in a large area, has a high light emission luminance, and provides sharp images. The present invention provides a scintillator panel including: a plate-like substrate; a grid-like barrier rib provided on the substrate; and a scintillator layer containing a phosphor filled in cells divided by the barrier rib, wherein the barrier rib is mainly composed of a low-melting-point glass, and the substrate is formed of a material which is mainly composed of a ceramic selected from the group consisting of alumina, aluminum nitride, mullite and steatite.

4 Claims, 1 Drawing Sheet

(51) Int. Cl.
G03F 7/40 (2006.01)
G21K 4/00 (2006.01)

(56) References Cited

U.S. PATENT DOCUMENTS

| | | | | |
|---|---|---|---|---|
| 2006/0163605 A1* | 7/2006 | Miyahara | ............... | C04B 35/453 |
| | | | | 257/103 |
| 2007/0262335 A1* | 11/2007 | Kumei | ................... | H01L 33/60 |
| | | | | 257/98 |
| 2010/0193822 A1* | 8/2010 | Inobe | ...................... | H01L 33/20 |
| | | | | 257/98 |
| 2014/0091235 A1 | 4/2014 | Iguchi | | |
| 2015/0241569 A1 | 8/2015 | Okamura | | |
| 2015/0316659 A1 | 11/2015 | Okamura | | |

FOREIGN PATENT DOCUMENTS

| | | |
|---|---|---|
| JP | 05060871 | 3/1993 |
| JP | 05188148 | 7/1993 |
| JP | 2002202373 | 7/2002 |
| JP | 2011007552 | 1/2011 |
| JP | 2011021924 | 2/2011 |

OTHER PUBLICATIONS

International Search Report for International Application No. PCT/JP2013/080650 dated Jan. 14, 2014.
Extended European Search Report dated Jun. 30, 2016 for European Application No. 13856742.5, 12 pages.

* cited by examiner

SCINTILLATOR PANEL AND METHOD FOR MANUFACTURING SCINTILLATOR PANEL

CROSS REFERENCE TO RELATED APPLICATIONS

This is the U.S. National Phase application of PCT/JP2013/080650, filed Nov. 13, 2013, which claims priority to Japanese Patent Application No. 2012-257209, filed Nov. 26, 2012, the disclosures of each of these applications being incorporated herein by reference in their entireties for all purposes.

FIELD OF THE INVENTION

The present invention relates to a scintillator panel which constitutes a radiation detector that is used for a medical diagnostic apparatus, a nondestructive inspection instrument and the like.

BACKGROUND OF THE INVENTION

X-ray images using films have been widely used heretofore in medical settings. However, the X-ray image using a film provides analog image information, and in recent years, radiation detectors capable of outputting digital images, such as computed radiography (CR) and flat panel radiation detectors (flat panel detectors: FPDs), have been developed. In an X-ray CT apparatus, a radiation detector that detects the radiation intensity is provided at a position opposite to an X-ray radiation source.

Radiation detectors are classified broadly into direct conversion-type detectors and indirect conversion-type detectors. In the indirect conversion-type detector, a scintillator panel is used for converting a radiation into visible light. The scintillator panel contains an X-ray phosphor such as cesium iodide (CsI), the X-ray phosphor emits visible light in response to an applied X-ray, and the emitted light is converted into an electric signal by a TFT or a CCD to thereby detect the X-ray intensity. However, a radiation detector having such a configuration has a problem of low S/N ratio. This is attributable to scattering of visible light by the phosphor itself when the X-ray phosphor emits light, etc. For reducing influences of the scattering of light, methods of filling a phosphor in cells divided by a barrier rib have been proposed (Patent Documents 1 to 4).

However, the method which has been heretofore used as a method for forming the barrier rib is a method of etching a silicon wafer, or a method in which a glass paste, a mixture of a pigment or a ceramic powder and a low-melting-point glass powder, is pattern-printed in multiple layers using a screen printing method, and then fired to form a barrier rib pattern. In the method of etching a silicon wafer, the size of a scintillator panel that can be formed is restricted by the size of a silicon wafer, and a scintillator panel having a large size of, for example, 500 mm square cannot be obtained. A plurality of small-size panels should be arranged for making a large-size panel, but production of a scintillator panel in this way is difficult in terms of accuracy, and it is difficult to prepare a large-area scintillator panel. Further, there is a disadvantage in terms of cost because an expensive single-crystal silicon wafer is used.

In the multi-layer screen printing method using a glass paste, processing of high accuracy is difficult due to a dimensional variation of a screen printing plate, etc. Further, when multi-layer screen printing is performed, a definite barrier rib width is required for enhancing the strength of a barrier rib pattern in order to prevent destructive defects of the barrier rib pattern. When the width of the barrier rib pattern increases, a space between barrier ribs becomes relatively small, so that a volume available for filling a phosphor decreases, and the filling amount is not uniform. Therefore, a scintillator panel obtained in this method has the disadvantage that the amount of an X-ray phosphor is so small that the luminescence is reduced, and luminous unevenness occurs. This makes it difficult to photograph sharp images in photographing in a low radiation dose.

That is, for preparing a scintillator panel which has high luminous efficiency and provides sharp images, a technique for processing a barrier rib, which is capable of processing the barrier rib with high accuracy over a large area and narrowing the width of the barrier rib, is required.

PATENT DOCUMENTS

Patent Document 1: Japanese Patent Laid-open Publication No. 5-60871
Patent Document 2: Japanese Patent Laid-open Publication No. 5-188148
Patent Document 3: Japanese Patent Laid-open Publication No. 2011-7552
Patent Document 4: Japanese Patent Laid-open Publication No. 2011-21924

SUMMARY OF THE INVENTION

An object of the present invention is to provide a scintillator panel which is provided with a narrow barrier rib with high accuracy in a large area, has a high light emission luminance, and provides sharp images.

The above-described object is achieved by any of the following technical means.

(1) A scintillator panel including: a plate-like substrate; a grid-like barrier rib provided on the substrate; and a scintillator layer containing a phosphor filled in cells divided by the barrier rib, wherein the barrier rib is formed of a material which is mainly composed of a low-melting-point glass, and the substrate is formed of a material which is mainly composed of a ceramic selected from the group consisting of alumina, aluminum nitride, mullite and steatite.

(2) The scintillator panel according to (1), wherein the low-melting-point glass contains 2 to 20% by mass of an alkali metal oxide.

(3) A method for manufacturing a scintillator panel including a plate-like substrate formed of a material which is mainly composed of a ceramic selected from the group consisting of alumina, aluminum nitride, mullite and steatite, a grid-like barrier rib provided on the substrate, and a scintillator layer containing a phosphor filled in cells divided by the barrier rib, the method including: a step of forming a photosensitive paste coating film by applying onto a substrate a photosensitive paste containing a low-melting-point glass powder and a photosensitive organic component; a step of exposing the obtained photosensitive paste coating film to light through a photomask having a predetermined opening; a development step of dissolving and removing a part of the exposed photosensitive paste coating film which is soluble in a developer to obtain a photosensitive paste coating film pattern; a firing step of heating the photosensitive paste coating film pattern after development to 500 to 700° C. to remove the organic component and soften and sinter the low-melting-point glass and thereby forming a barrier rib; and a step of filling a phosphor in cells divided by the barrier rib.

According to the present invention, a narrow barrier rib can be formed with high accuracy in a large area, so that there can be provided a scintillator panel which has a large size and allows sharp images to be photographed, and a method for manufacturing the scintillator panel.

DETAILED DESCRIPTION OF EMBODIMENTS OF THE INVENTION

The preferred configurations of a scintillator panel of the present invention and a radiation detector using the scintillator panel will be described below with reference to the drawings, but the present invention is not limited thereto.

Figure 1:
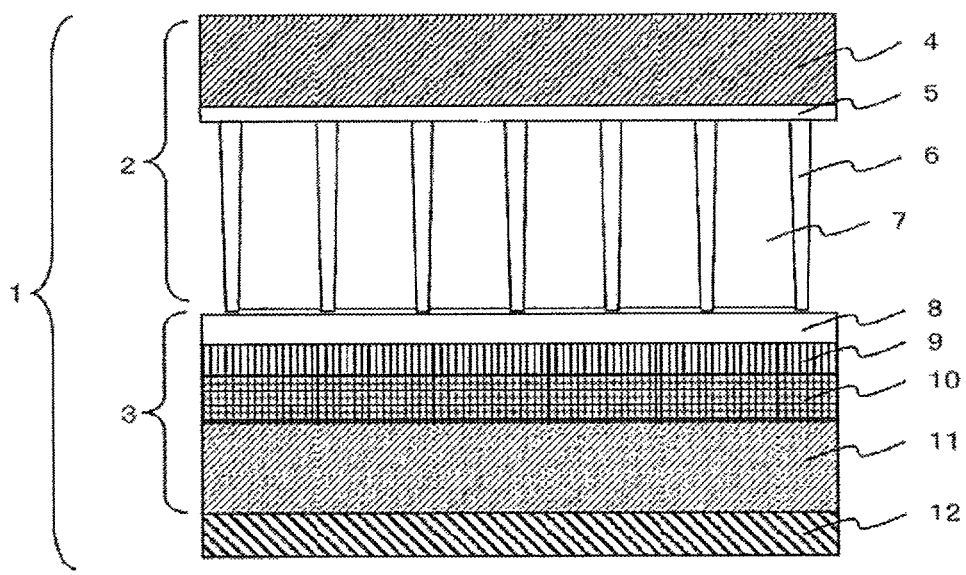
FIG. 1 is a sectional view schematically showing the configuration of a radiation detector including a scintillator panel of an embodiment of the present invention.
Figure 2:
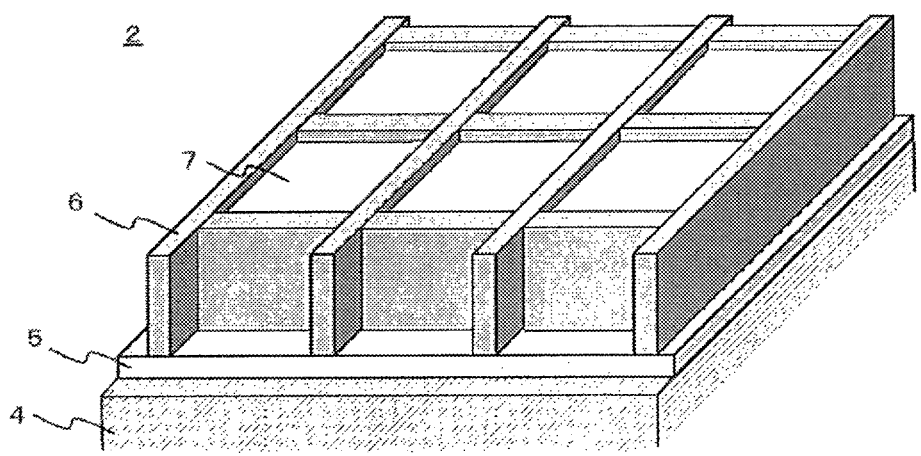
FIG. 2 is a perspective view schematically showing the configuration of the scintillator panel of an embodiment of the present invention.

FIG. 1 is a sectional view schematically showing the configuration of a radiation detector including a scintillator panel of an embodiment of the present invention. FIG. 2 is a perspective view schematically showing the configuration of the scintillator panel of an embodiment of the present invention. A radiation detector 1 includes a scintillator panel 2, an output substrate 3 and a power supply portion 12. The scintillator panel 2 includes a scintillator layer 7 containing a phosphor, and absorbs energy of an incident radiation such as an X-ray to emit an electromagnetic wave having a wavelength ranging from 300 to 800 nm, i.e. an electromagnetic wave (light) which ranges from ultraviolet light to infrared light with visible light at the center.

The scintillator panel 2 includes a substrate 4, a grid-like barrier rib 6 formed on the substrate and intended for dividing cells, and the scintillator layer 7 containing a phosphor filled in a space formed by the barrier rib. By further forming a buffer layer 5 between the substrate 1 and the barrier rib 6, the barrier rib 6 can be stably formed. By increasing the reflectivity of the buffer layer 5 to visible light, light emitted at the scintillator layer 7 can be made to reach a photoelectric conversion layer 9 on the output substrate 3 efficiently.

The output substrate 3 has on a substrate 11 the photoelectric conversion layer 9 in which photosensors and pixels composed of TFT are two-dimensionally formed, and an output layer 10. When the light exit surface of the scintillator panel 2 and the photoelectric conversion layer 9 of the output substrate 3 are bonded or adhered to each other with a diaphragm layer 8, which is composed of a polyimide resin or the like, interposed therebetween, the radiation detector 1 is formed. Light emitted at the scintillator layer 7 reaches the photoelectric conversion layer 9, undergoes photoelectric conversion at the photoelectric conversion layer 9, and exits. In the scintillator panel of an embodiment of the present invention, each cell is divided by a barrier rib, and therefore when the size and pitch of pixels of a photoelectric conversion element arranged in a grid-like shape are made coincident with the size and pitch of cells of the scintillator panel, scattered light can be prevented from reaching a neighboring cell even if light is scattered by a phosphor. In this way, blurring of images resulting from light scattering can be reduced, so that high-accuracy photographing is possible.

A substrate to be used for the scintillator panel of the present invention should preferably be formed of a material which is mainly composed of a ceramic selected from the group consisting of alumina, aluminum nitride, mullite and steatite. Such a substrate has high reflecting properties, a high strength, high flatness, high X-ray permeability and high heat resistance, and also has a thermal expansion coefficient adequate for a substrate for forming a barrier rib by a photosensitive paste method. The phrase "mainly composed of a ceramic" means that a ceramic constitutes 20 to 100% by mass, more preferably 50 to 100% by mass, of a material that forms the substrate. If the content of the ceramic is less than 20% by mass, the reflecting properties of the substrate are deteriorated.

Here, the mullite refers to a material having a composition of $3Al_2O_3.2SiO_2$ to $2Al_2O_3—SiO_2$. The steatite refers to a fired product of talc ($3MgO.4SiO_2.H_2O$) as well as a material which is mainly composed of $MgO.SiO_2$.

The reflectivity of the substrate to light having a wavelength of 550 nm is preferably 20% or more, more preferably 40% or more, further preferably 70% or more for making it possible to photograph sharper images by increasing the light emission luminance of the scintillator panel.

The material that forms the substrate may contain other ceramic materials and other components such as a borosilicate glass in an amount of less than 80% by mass in addition to a ceramic selected from the group consisting of alumina, aluminum nitride, mullite and steatite. For example, a substrate composed of zirconia-reinforced alumina with 5 to 50% by mass of zirconia added to 50 to 95% by mass of alumina, or a glass ceramic substrate composed of a mixture of 20 to 80% by mass of alumina and 20 to 80% by mass of a glass powder can be suitably used.

The glass powder as a raw material of the glass ceramic substrate is preferably an oxide glass such as a borosilicate glass, a borate glass, a silicate glass, a phosphate glass, a lead borate glass, a lead borosilicate glass or a bismuth silicate glass for controlling the reflecting properties, colorability, thermal expansion coefficient or panel strength of the glass ceramic substrate.

The glass ceramic substrate can be prepared by firing a green sheet composed of a ceramic fine powder, a glass powder and a binder. The glass ceramic substrate may be obtained by firing a single-layer green sheet, but a laminated glass ceramic substrate prepared by laminating a plurality of green sheets and firing the laminate is preferable because reflecting properties are improved.

A substrate to be used for the scintillator panel of the present invention is preferably a polycrystalline substance produced by firing a raw material containing, as a main component in inorganic components, a fine powder of a ceramic selected from the group consisting of alumina, aluminum nitride, mullite and steatite. When the substrate is a polycrystalline substance, light is easily scattered, so that the reflectivity of the substrate is improved.

The chemical composition of the substrate can be conveniently confirmed by quantitatively analyzing the contained element species by fluorescent X-ray analysis. More specifically, the content of each component as a polycrystalline substance can be determined by using methods such as ICP emission spectroscopic analysis, atomic absorption spectrometry and powder X-ray diffractometry in combination.

The thermal expansion coefficient of the substrate is preferably 40 to $90 \times 10^{-7}$/K for suppressing warpage that may cause breakage of a panel, crosstalk of emitted light and so on. Further, it is more preferable that the thermal expansion coefficient of the substrate is made larger than the thermal expansion coefficient of a low-melting-point glass that forms a barrier rib because the scintillator panel and the output substrate can be adhesively bonded to each other to reduce crosstalk.

The thickness of the substrate is preferably 0.1 to 2.0 mm, more preferably 0.1 to 0.7 mm for ensuring that the substrate has a sufficient strength, a sufficient reflectivity and sufficient X-ray permeability. If the thickness of the substrate is less than 0.1 mm, the reflectivity of the substrate easily decreases, and the strength of the substrate decreases, so that breakage of the scintillator panel easily occurs. If the thickness of the substrate is more than 2.0 mm, the X-ray permeability decreases.

A barrier rib is formed on the substrate, and it is preferable that the barrier rib is formed of a glass material in terms of durability and heat resistance. In the scintillator panel of an embodiment of the present invention, the barrier rib is formed of a material which is mainly composed of a low-melting-point glass. The material which is mainly composed of a low-melting-point glass has a proper softening temperature, and is therefore suitable for forming a narrow barrier rib with high accuracy in a large area using a photosensitive paste method. Here, the low-melting-point glass refers to a glass having a softening temperature of 700° C. or lower. The phrase "mainly composed of a low-melting-point glass" means that a low-melting-point glass powder constitutes 50 to 100% by mass of a material that forms the barrier rib. If the low-melting-point glass is not a main component, the strength of the barrier rib decreases.

A method for manufacturing a scintillator panel according to the present invention includes a step of forming a photosensitive paste coating film by applying a photosensitive paste containing a low-melting-point glass powder and a photosensitive organic component onto a substrate formed of a material which is mainly composed of a ceramic selected from the group consisting of alumina, aluminum nitride, mullite and steatite; an exposure step of exposing the obtained photosensitive paste coating film to light through a photomask having a predetermined opening; a development step of dissolving and removing a part of the exposed photosensitive paste coating film which is soluble in a developer to obtain a photosensitive paste coating film pattern; and a firing step of heating the photosensitive paste coating film pattern after development to a high temperature to remove the organic component and soften and sinter the low-melting-point glass and thereby forming a barrier rib. In the exposure step, a necessary part of the photosensitive paste coating film is photocured, or an unnecessary part of the photosensitive paste coating film is photodecomposed by exposure to add a contrast of dissolution of the photosensitive paste coating film in a developer. In the development step, an unnecessary part of the exposed photosensitive paste coating film is removed with a developer, so that a photosensitive paste coating film pattern in which only a necessary part of the coating film remains is obtained.

In the firing step, the obtained photosensitive paste coating film pattern is fired at a temperature of preferably 500 to 700° C., more preferably 500 to 650° C. When the photosensitive paste coating film pattern is fired at a temperature in the above-mentioned range, the organic component is decomposed and distilled away, and the low-melting-point glass powder is softened and sintered to form a barrier rib containing a low-melting-point glass. For completely removing the organic component, the firing temperature is preferably 500° C. or higher. If the firing temperature is higher than 700° C., deformation of the substrate in the firing step increases, and therefore the firing temperature is preferably 700° C. or lower.

Preferably, the photosensitive paste to be used in the method for manufacturing a scintillator panel according to the present invention is mainly composed of a low-melting-point glass. The phrase "mainly composed of a low-melting-point glass" means that a low-melting-point glass powder constitutes 50 to 100% by mass of an inorganic component in the photosensitive paste. By using such a photosensitive paste, a barrier rib formed of a material which is mainly composed of a low-melting-point glass can be formed.

The method for manufacturing a scintillator panel according to the present invention is capable of processing with high accuracy as compared to a processing method in which a glass paste is printed by laminating by multi-layer screen printing and then fired.

The photosensitive paste is formed of an organic component containing a photosensitive organic component, and an inorganic powder containing a low-melting-point glass powder. The organic component is required in a definite amount for forming a photosensitive paste coating film pattern before firing, but if the amount of the organic component is excessively large, the amount of substances removed in the firing step increases, so that the shrinkage rate after firing becomes large, and therefore pattern defects easily occurs in the firing step. On the other hand, when the amount of the organic component is excessively small, miscibility and dispersibility of inorganic fine particles in the paste are deteriorated, so that not only defects easily occur during firing, but also coatability of the paste is deteriorated due to an increase in viscosity of the paste, and further the stability of the paste is adversely affected. Thus, the content of the inorganic powder in the photosensitive paste is preferably 30 to 80% by mass, more preferably 40 to 70% by mass. The content of the low-melting-point glass powder is preferably 50 to 100% by mass based on the total of the inorganic powder.

For ensuring that in the firing step, the organic component is almost completely removed and the barrier rib obtained has a definite strength, it is preferable to use a glass powder composed of a low-melting-point glass having a softening temperature of 480° C. or higher. If the softening temperature is lower than 480° C., the low-melting-point glass is softened before the organic component is sufficiently removed during firing, so that residues of the organic component are captured in the glass. In this case, the organic component may be gradually released later to deteriorate product quality. Further, residues of the organic component captured in the glass become a cause of coloring of the glass. When a low-melting-point glass powder having a softening temperature of 480° C. or higher is used and firing is performed at a temperature of 500° C. or higher, the organic component can be completely removed. Since the firing temperature in the firing step is preferably 500 to 700° C., more preferably 500 to 650° C. as described above, the softening temperature of the low-melting-point glass is preferably 480 to 700° C., more preferably 480 to 640° C., further preferably 480 to 620° C.

The softening temperature is determined by extrapolating a heat absorption completion temperature at an endothermic peak by a tangent method from a DTA curve obtained by measuring a sample using a differential thermal analyzer (DTA, "Differential Type Differential Thermal Balance TG8120" manufactured by Rigaku Corporation). Specifically, an inorganic powder as a measurement sample is measured by elevating the temperature at 20° C./minute from room temperature with an alumina powder as a standard sample using a differential thermal analyzer, thereby obtaining a DTA curve. A softening point Ts determined by extrapolating a heat absorption completion temperature at an endothermic peak by a tangent method from the obtained DTA curve is defined as a softening temperature.

The thermal expansion coefficient of the low-melting-point glass is preferably 40 to $90 \times 10^{-7}$/K. If the thermal expansion coefficient is more than $90 \times 10^{-7}$/K when a photosensitive paste coating film containing a low-melting-point glass is formed on a substrate and fired, the panel is significantly warped, and therefore construction as a radiation detector is difficult. In a radiation detector with warpage occurring in a panel, it is difficult to detect high-definition images because crosstalk of emitted light occurs in the panel plane, or variations occur in detection sensitivity of an amount of emitted light. If the thermal expansion coefficient is less than $40 \times 10^{-7}$/K, the softening temperature of the low-melting-point glass cannot be sufficiently lowered.

For obtaining a low-melting-point glass, a metal oxide selected from lead oxide, bismuth oxide, zinc oxide and alkali metal oxides, which are materials effective for lowering the melting point of glass, can be used. Particularly, it is preferable to adjust the softening temperature of glass using an alkali metal oxide. Generally the alkali metal refers to lithium, sodium, potassium, rubidium and cesium, but the alkali metal oxide in the present invention refers to a metal oxide selected from the group consisting of lithium oxide, sodium oxide and potassium oxide.

The content X of an alkali metal oxide ($M_2O$) in the low-melting-point glass is preferably 2 to 20% by mass. If the content of the alkali metal oxide is less than 2% by mass, the softening temperature becomes high, and therefore it is preferred to perform the firing step at a high temperature. Accordingly, it is likely that the scintillator panel obtained is distorted or defects occur in the barrier rib due to deformation of the substrate in the firing step, and therefore the content of less than 2% by mass is not suitable. If the content of the alkali metal oxide is more than 20% by mass, the viscosity of glass decreases too much in the firing step. Accordingly, the shape of the barrier rib obtained is easily distorted. Further, the porosity of the barrier rib obtained becomes excessively small, leading to a decrease in light emission luminance of the scintillator panel obtained.

Further, it is preferable that the low-melting-point glass contains 3 to 10% by mass of zinc oxide in addition to the alkali metal oxide for adjusting the viscosity of glass at a high temperature. If the content of zinc oxide is 3% by mass or less, the viscosity of glass at a high temperature becomes high, and if the content of zinc oxide is 10% by mass or more, the cost of glass tends to increase.

Further, by including, in addition to the alkali metal oxide and zinc oxide, silicon oxide, boron oxide, aluminum oxide, an oxide of an alkali earth metal or the like in the low-melting-point glass, the stability, crystallinity, transparency, refractive index, thermal expansion characteristic and the like of the low-melting-point glass can be controlled. As a composition of the low-melting-point glass, the composition range shown below is preferable because a low-melting-point glass having a viscosity characteristic suitable for the present invention can be prepared.

Alkali metal oxide: 2 to 20% by mass
Zinc oxide: 3 to 10% by mass
Silicon oxide: 20 to 40% by mass
Boron oxide: 25 to 40% by mass
Aluminum oxide: 10 to 30% by mass
Alkali earth metal oxide: 5 to 15% by mass Here, the alkali earth metal refers to one or more metals selected from the group consisting of magnesium, calcium, barium and strontium.

The particle diameter of the low-melting-point glass powder can be evaluated using a particle size distribution analyzer ("MT 3300" manufactured by NIKKISO CO., LTD.). As a measurement method, an inorganic powder is charged in a sample chamber filled with water, and subjected to an ultrasonic treatment for 300 seconds, followed by performing a measurement.

The 50% volume average particle diameter (D50) is preferably in a range of 1.0 to 4.0 µm as a particle diameter of the low-melting-point glass powder. If the D50 is less than 1.0 µm, agglomeration of particles becomes strong, so that it becomes difficult to achieve uniform dispersibility, leading to unstable fluidity of a paste. In this case, thickness uniformity when a paste is applied is deteriorated. If the D50 is more than 4.0 µm, the surface unevenness of a sintered body obtained increases, so that a pattern tends to be broken in a subsequent step.

The photosensitive paste to be used in the method for manufacturing a scintillator panel according to the present invention may contain as a filler a high-melting-point glass that is not softened at 700° C., or ceramic particles such as those of silicon oxide, cordierite, mullite or feldspar in addition to the above-described low-melting-point glass powder. The filler, when used together with the low-melting-point glass powder, has an effect of controlling the shrinkage rate after firing of a paste composition and retaining the shape of the barrier rib formed. However, if the ratio of the filler to the total of the inorganic powder is more than 50% by mass, sintering of the low-melting-point glass powder is hindered to cause a problem such as a reduction in strength of the barrier rib, and therefore the ratio of more than 50% by mass is not preferable. Preferably, the filler has a D50 of 0.5 to 4.0 µm for the same reason as that described for the low-melting-point glass powder. The D50 of the filler can be evaluated by a method similar to that for the low-melting-point glass powder.

In the photosensitive paste, the refractive index n1 of the low-melting-point glass powder or the filler and the average refractive index n2 of the photosensitive organic component satisfy preferably $-0.1 < n1-n2 < 0.1$, more preferably $-0.01 \leq n1-n2 \leq 0.01$, further preferably $-0.005 \leq n1-n2 \leq 0.005$. By satisfying the above-described requirement, light scattering at the interface between the low-melting-point glass powder or the filler and the photosensitive organic component is suppressed in the exposure step, so that pattern formation can be performed with high accuracy. By adjusting the compounding ratio of oxides that form the low-melting-point glass powder, a low-melting-point glass powder having both a preferable heat characteristic and a preferable refractive index can be obtained.

The refractive index of the low-melting-point glass powder or the filler can be measured using a Becke line detection method. A refractive index at 25° C. and at a wavelength of 436 nm (g-ray) was defined as the refractive index of the low-melting-point glass powder or the filler. The average refractive index of the photosensitive organic component can be determined by measuring a coating film composed of a photosensitive organic component by ellipsometry. A refractive index at 25° C. and at a wavelength of 436 nm (g-ray) was defined as the average refractive index of the photosensitive organic component.

When the photosensitive paste includes a photosensitive organic component as an organic component, it can be pattern-processed by the photosensitive paste method described above. By using a photosensitive monomer, a photosensitive oligomer, a photosensitive polymer, a photo-polymerization initiator or the like as the photosensitive organic component, reactivity can be controlled. Here, the photosensitivity in the photosensitive monomer, the photosensitive oligomer and the photosensitive polymer means that when the paste is irradiated with active light rays, the photosensitive monomer, the photosensitive oligomer or the photosensitive polymer undergoes a reaction of photo-cross-linking, photopolymerization or the like to change the chemical structure.

The photosensitive monomer is a compound having an active carbon-carbon double bond, and monofunctional compounds and polyfunctional compounds having a vinyl group, an acryloyl group, a methacryloyl group or an acrylamide group as a functional group are preferably used. Particularly, a photosensitive paste including in an organic component 10 to 80% by mass of a compound selected from polyfunctional acrylate compounds and polyfunctional methacrylate compounds is preferable in that the crosslinking density during curing is increased by a photoreaction to improve pattern formability. As the polyfunctional acrylate compounds and polyfunctional methacrylate compounds, a variety of kinds of compounds have been developed, and an appropriate one can be selected from those compounds in consideration of reactivity, a refractive index and the like.

As the photosensitive oligomer and the photosensitive polymer, oligomers and polymers having an active carbon-carbon double bond are preferably used. The photosensitive oligomer and the photosensitive polymer are obtained by, for example, copolymerizing a carboxyl group-containing monomer such as acrylic acid, methacrylic acid, itaconic acid, crotonic acid, maleic acid, fumaric acid, 3-butenoic acid or an acid anhydride thereof, and a monomer such as a methacrylic acid ester, an acrylic acid ester, styrene, acrylonitrile, vinyl acetate or 2-hydroxyethyl acrylate. As a method for introducing an active carbon-carbon double bond into an oligomer or a polymer, a method can be used in which acrylic acid chloride, methacrylic acid chloride or acryl chloride, an ethylenically unsaturated compound having a glycidyl group or an isocyanate group, or a carboxylic acid such as maleic acid is reacted with a mercapto group, an amino group, a hydroxyl group or a carboxyl group in an oligomer or a polymer, etc.

By using as the photosensitive monomer or the photosensitive oligomer a monomer or oligomer having a urethane structure, a photosensitive paste insusceptible to pattern defects in the firing step can be obtained. Pattern defects can be suppressed because rapid shrinkage is hard to occur in the process of sintering of a glass powder in the later stage of the firing step due to use of a low-melting-point glass powder as the glass powder. In addition, when a compound having a urethane structure is used for the organic component, stress is relaxed in the process of decomposition and distillation of the organic component in the early stage of the firing step, so that pattern defects are hard to occur. Owing to both the effects described above, pattern defects can be suppressed over a wide temperature range.

The photo-polymerization initiator is a compound which generates radicals when irradiated with an active light source. Specific examples thereof include benzophenone, methyl ortho-benzoylbenzoate, 4,4-bis(dimethylamino)benzophenone, 4,4-bis(diethylamino)benzophenone, 4,4-dichlorobenzophenone, 4-benzoyl-4-methyl diphenyl ketone, dibenzyl ketone, fluorenone, 2,2-dimethoxy-2-phenylacetophenone, 2-hydroxy-2-methylpropiophenone, thioxanthone, 2-methylthioxanthone, 2-chlorothioxanthone, 2-isopropylthioxanthone, diethylthioxanthone, benzyl, benzyl methoxyethyl acetal, benzoin, benzoin methyl ether, benzoin butyl ether, anthraquinone, 2-t-butylanthraquinone, anthrone, benzanthrone, dibenzosuberone, methylene anthrone, 4-azidobenzalacetophenone, 2,6-bis(p-azidobenzylidene)cyclohexanone, 2,6-bis(p-azidobenzylidene)-4-methylcyclohexanone, 1-phenyl-1,2-butadione-2-(O-methoxycarbonyl)oxime, 1-phenyl-1,2-propanedione-2-(O-ethoxycarbonyl)oxime, 1,3-diphenylpropanetrione-2-(O-ethoxycarbonyl)oxime, 1-phenyl-3-ethoxypropanetrione-2-(O-benzoyl)oxime, Michler ketone, 2-methyl-1-[4-(methylthio)phenyl]-2-morphorino-1-propanone, 2-benzyl-2-dimethylamino-1-(4-morpholinophenyl)butanone-1, naphthalenesulfonyl chloride, quinolinesulfonyl chloride, N-phenylthioacridone, benzothiazole disulfide, triphenylphosphine, benzoin peroxide and eosine, and combinations of a photo-reductive pigments such as methylene blue and reducing agents such as ascorbic acid and triethanolamine. These compounds may be used in combination of two or more thereof.

The photosensitive paste may contain as a binder a copolymerized polymer having a carboxyl group. The copolymer having a carboxyl group is obtained by, for example, selecting a carboxyl group-containing monomer such as acrylic acid, methacrylic acid, itaconic acid, crotonic acid, maleic acid, fumaric acid, 3-butenoic acid or an acid anhydride thereof and other monomers such as a methacrylic acid ester, an acrylic acid ester, styrene, acrylonitrile, vinyl acetate or 2-hydroxyethyl acrylate, and copolymerizing the monomers using an initiator such as azobisisobutyronitrile. As the copolymer having a carboxyl group, a copolymer having an acrylic acid ester or a methacrylic acid ester and an acrylic acid or a methacrylic acid as copolymerization components is preferably used because the thermal decomposition temperature during firing is low.

The photosensitive paste is a paste excellent in solubility in an alkali aqueous solution when it contains a copolymerized polymer having a carboxyl group. The acid value of the copolymer having a carboxyl group is preferably 50 to 150 mg KOH/g. When the acid value is 150 mg KOH/g or less, the allowable range of development can be widened. When the acid value is 50 mg KOH/g or more, solubility of an unexposed part in a developer is not reduced. Therefore, it is not necessary to increase the concentration of a developer, and peeling of an exposed part is prevented, so that a high-definition pattern can be obtained. Further, it is also preferable that the copolymer having a carboxyl group has an ethylenically unsaturated group on a side chain. Examples of the ethylenically unsaturated group include an acryloyl group, a methacryloyl group, a vinyl group and an allyl group.

The photosensitive paste is prepared by adding an organic solvent and a binder as required to a low-melting-point glass powder and a photosensitive organic component composed of a photosensitive monomer, a photosensitive oligomer, a photosensitive polymer, a photo-polymerization initiator or the like, and compounding various components so as to achieve a predetermined composition, followed by uniformly mixing and dispersing the mixture using a three-roll roller or a kneader.

The viscosity of the photosensitive paste can be appropriately adjusted by the added ratios of an inorganic powder, a thickener, an organic solvent, a polymerization inhibitor, a plasticizer, a precipitation preventive agent or the like, and is preferably in a range of 2 to 200 Pa·s. For example, when the photosensitive paste is applied to the substrate by a spin coating method, a viscosity of 2 to 5 Pa·s is preferable. When the photosensitive paste is applied to the substrate by a screen printing method to achieve a film thickness of 10 to 40 μm in one application, a viscosity of 50 to 200 Pa·s is preferable. When a blade coater method, a die coater method or the like is used, a viscosity of 10 to 50 Pa·s is preferable.

By applying the photosensitive paste thus obtained onto the substrate, forming a desired pattern by a photolithography method and performing firing, a barrier rib can be formed. An example of manufacturing a barrier rib by the photolithography method using the above-described photosensitive paste will be described, but the present invention is not limited thereto.

The photosensitive paste is applied onto the whole or part of the surface of the substrate to form a photosensitive paste coating film. As an application method, a screen printing method, or a method using a bar coater, a roll coater, a die coater or a blade coater, or the like can be used. The coating thickness can be adjusted by selecting the number of applications, a mesh of the screen, and a viscosity of the paste.

Subsequently, an exposure step is performed. Generally, exposure is performed through a photomask as in usual photolithography. Alternatively, a method of directly making a drawing by laser light, etc. without using a photomask may be used. As an exposure device, a proximity exposure machine or the like can be used. When exposure of a large area is performed, a large area can be exposed with an exposure machine having a small exposure area by performing exposure while carrying out conveyance after applying the photosensitive paste onto the substrate. Examples of the active light ray used at this time include a near infrared ray, a visible light ray and an ultraviolet ray. Among them, the ultraviolet ray is most preferable, and as a light source thereof, for example, a low-pressure mercury lamp, a high-pressure mercury lamp, an ultra-high pressure mercury lamp, a halogen lamp, a germicidal lamp or the like can be used. Among them, the ultra-high pressure mercury lamp is preferred. Exposure conditions vary depending on the coating thickness, and usually exposure is performed for 0.01 to 30 minutes using an ultra-high pressure mercury lamp with a power of 1 to 100 mW/cm$^2$.

After exposure, development is performed using a difference in solubility in a developer between an exposed part and an unexposed part of the photosensitive paste coating film, thereby obtaining a desired grid-shaped photosensitive paste coating film pattern. Development is performed using a dipping method, a spray method or a brush method. For the developer, a solvent capable of dissolving the organic component in the paste can be used. Preferably the developer is mainly composed of water. When a compound having an acidic group such as a carboxyl group exists in the paste, development can be performed with an alkali aqueous solution. As the alkali aqueous solution, an inorganic alkali aqueous solution such as that of sodium hydroxide, sodium carbonate or calcium hydroxide can be used, but use of an organic alkali aqueous solution is more preferable because an alkali component is easily removed during firing. Specific examples of the organic alkali include tetramethylammonium hydroxide, trimethylbenzylammonium hydroxide, monoethanolamine and diethanolamine. The concentration of the alkali aqueous solution is preferably 0.05 to 5% by mass, more preferably 0.1 to 1% by mass. If the alkali concentration is excessively low, a soluble part may not be removed, and if the alkali concentration is excessively high, a pattern part may be peeled to corrode a non-soluble part. The temperature of the developer during development is preferably 20 to 50° C. in terms of process control.

Next, a firing step is performed in a firing furnace. The atmosphere and temperature for the firing step vary depending on the types of the photosensitive paste and the substrate, but firing is performed in air or in an atmosphere of nitrogen, hydrogen or the like. As the firing furnace, a batch-type firing furnace or a belt-type continuous firing furnace can be used. Preferably, firing is performed while the temperature is kept at normally 500 to 700° C. for 10 to 60 minutes. The firing temperature is more preferably 500 to 650° C. By the step described above, the organic component is removed from the grid-shaped photosensitive paste coating film pattern, and the low-melting-point glass contained in the coating film pattern is softened and sintered to obtain a barrier rib member in which a grid-like barrier rib substantially composed of an inorganic substance is formed on a substrate.

The height (H) of the barrier rib is preferably 100 to 1000 μm, more preferably 160 to 500 μm, further preferably 250 to 500 μm. If the height of the barrier rib is more than 1000 μm, pattern formation during processing is difficult. On the other hand, if the height of the barrier rib is low, the amount of a phosphor capable of being filled decreases, and therefore the light emission luminance of a scintillator panel obtained decreases, so that it is difficult to photograph sharp images.

The pattern shape of the barrier rib is not particularly limited, but is preferably a grid-like shape or a stripe-like shape. When a grid-like pattern is formed, the pitch (P) of the barrier rib is preferably 60 to 1000 μm. If the pitch is less than 60 μm, pattern formation during processing is difficult. If the pitch is excessively large, it is difficult to perform image photographing with high accuracy using a scintillator panel obtained.

Preferably, the bottom width (Lb) of the barrier rib is 20 to 150 μm and the top width (Lt) of the barrier rib is 15 to 80 μm. If the bottom width of the barrier rib is less than 20 μm, defects easily occur in the barrier rib during firing. On the other hand, if the bottom width of the barrier rib is large, the amount of a phosphor that can be filled in spaces divided by the barrier rib decreases. If the top width of the barrier rib is less than 15 μm, the strength of the barrier rib decreases. On the other hand, if the top width of the barrier rib is more than 80 μm, a region in the scintillator layer, which is available for extraction of emitted light, is narrowed. The aspect ratio (H/Lb) of the barrier rib height (H) to the barrier rib bottom width (Lb) is preferably 1.0 to 25.0. A barrier rib having a higher aspect ratio (H/Lb) to the barrier rib bottom width provides a larger space per one pixel divided by the barrier rib, so that a larger amount of a phosphor can be filled.

The aspect ratio (H/P) of the barrier rib height (H) to the barrier rib pitch (P) is preferably 0.1 to 3.5. A barrier rib having a higher aspect ratio (H/P) to the barrier rib pitch ensures that one pixel is divided with higher definition and a larger amount of a phosphor can be filled in a space per one pixel.

As a shape of the cell divided by the grid-like barrier rib, a shape such as square, rectangle, parallelogram or trapezoid can be appropriately selected. In the scintillator panel of the present invention, a grid-like barrier rib with which the shape of the cell is square is preferable in terms of uniformity of the barrier rib bottom width and uniformity of the phosphor light emission intensity in one pixel.

The height and width of the barrier rib were measured by exposing a barrier rib cross section perpendicular to the substrate and observing the cross section with a scanning electron microscope (manufactured by Hitachi, Ltd., "S2400"). The width of the barrier rib at a contact part between the barrier rib and the substrate was measured as the bottom width (Lb). The width at the topmost part of the barrier rib was measured as the top width (Lt).

The barrier rib is formed by sintering an inorganic powder contained in a photosensitive paste. Inorganic powders that form the barrier rib are fused together, but a pore part exists between the powders. The ratio of the pores included in the barrier rib can be adjusted by the thermal design in the firing step of firing the barrier rib. It is preferable that the ratio of the pore part to the whole barrier rib (porosity) is 2 to 25% because a barrier rib having both a proper reflection characteristic to visible light and a proper strength can be formed. If the porosity is less than 2%, the reflectivity of the barrier rib is low, and therefore the light emission luminance of a scintillator panel obtained decreases. If the porosity is more than 25%, the barrier rib has an insufficient strength, and is therefore easily collapsed. For achieving both a proper reflection characteristic and a proper strength, the porosity is more preferably 5 to 25%, further preferably 5 to 20%.

A method for measuring the porosity includes precisely polishing a cross section of a barrier rib, then observing the cross section with an electron microscope, converting an inorganic material part and a pore part into images in a two-gray scale, and calculating a ratio of the area of the pore part to the area of the barrier rib cross section.

Preferably a buffer layer composed of an inorganic component selected from a low-melting-point glass and a ceramic is provided between the barrier rib and the substrate. The buffer layer has an effect of relaxing stress on the barrier rib to achieve stable barrier rib formation in the firing step. It is preferable that the buffer layer has a high reflectivity because the light emission luminance of the scintillator panel can be enhanced by reflecting visible light emitted by a phosphor toward a photoelectric conversion element. For enhancing the reflectivity, it is preferable that the buffer layer is composed of a low-melting-point glass and a ceramic. As the low-melting-point glass, one similar to that for the barrier rib can be used. The ceramic is preferably titanium oxide, aluminum oxide, zirconium oxide or the like.

For forming the buffer layer, a paste formed by dispersing an organic component and an inorganic powder such as a low-melting-point glass powder or a ceramic powder in a solvent is applied to a base and dried to form a buffer layer paste coating film. Next, the buffer layer paste coating film is fired to form a buffer layer, and the firing temperature is preferably 500 to 700° C., more preferably 500 to 650° C.

It is also possible to perform firing of the buffer layer and firing of the barrier rib simultaneously. By using the simultaneous firing, the number of firing steps can be reduced, so that energy consumed in the firing step can be reduced. When simultaneous firing of the buffer layer and the barrier rib is used, it is preferable that using a photosensitive organic component similar to the aforementioned barrier rib photosensitive paste as an organic component of a buffer layer paste, a buffer layer paste coating film is formed, followed by exposing the whole surface of the buffer layer paste coating film to light to cure the coating film. It is also preferable that using as an organic component of a buffer layer paste a thermosetting organic component containing a polymerizable compound selected from polymerizable monomers, polymerizable oligomers and polymerizable polymers, and a thermal polymerization initiator, a buffer layer paste coating film is formed, followed by performing heat curing. According to these methods, the buffer layer paste coating film is made insoluble in a solvent, and therefore the buffer layer paste coating film can be prevented from being dissolved or peeled in a step of applying a barrier rib photosensitive paste onto the coating film.

To the buffer layer paste can be appropriately added a binder such as ethyl cellulose, a dispersing agent, a thickener, a plasticizer, a precipitation preventive agent or the like in addition to the components described above.

Next, a phosphor is filled in cells divided by the barrier rib, whereby a scintillator panel can be completed. Here, the cell refers to a space divided by a grid-like barrier rib. The layer containing a phosphor filled in the cell is referred to as a scintillator layer. Examples of the component, other than a phosphor, which is contained in the scintillator layer include organic binders such as ethyl cellulose and activators such as indium (In), but the scintillator layer may be formed only of a phosphor.

For the phosphor, various known phosphor materials can be used. Particularly, the phosphor material is preferably CsI, CsBr, $BaF_2$, BaFI, BaFBr, GOS ($Gd_2O_2S$), GSO ($Gd_2SiO_5$), BGO ($BiGe_3O_{12}$), LSO ($Lu_2SiO_5$), $CaWO_4$ or the like which has a relatively high conversion rate of an X-ray to visible light. For enhancing luminous efficiency, various kinds of activators may be added to the phosphor. For example, it is preferable to add an activator such as indium (In), thallium (Ti), lithium (Li), potassium (K), rubidium (Rb), sodium (Na), terbium (Tb), europium (Eu) or praseodymium (Pr) to the phosphor.

For formation of a scintillator layer, for example, a method in which a phosphor is deposited by vacuum deposition; a method in which a slurry of a phosphor dispersed in water is applied to a substrate; or a method in which a phosphor paste prepared by mixing a phosphor powder, an organic binder such as ethyl cellulose or an acrylic resin, and an organic solvent such as terpineol or γ-butyrolactone is applied using screen printing or a dispenser, can be used.

For the amount of a phosphor filled in cells divided by the barrier rib, the volume fraction of the phosphor to the space volume in the cell (hereinafter, referred to as a phosphor volume filling ratio) is preferably 55 to 100%, more preferably 60 to 100%, further preferably 70 to 100%. If the phosphor volume fraction is less than 55%, incident X-rays cannot be efficiently converted to visible light. For enhancing conversion efficiency of incident X-rays, it is preferable to fill the phosphor in the space of the cell with a high density.

EXAMPLES

The present invention will be described in detail below by way of examples. However, the present invention is not limited thereto.

(Measurement of Reflectivity of Substrate)

The reflectivity of a substrate to light having a wavelength of 550 nm was measured by a spectral colorimeter ("CM-2002" manufactured by KONICA MINOLTA, INC) in SCI mode.

(Substrate)

The following substrates were used. The substrates each had a size of 150×150 mm.

Substrate A: aluminum nitride substrate (a polycrystalline substance having a composition of AlN: 96% by mass and $Y_2O_3$: 4% by mass), thickness: 0.7 mm, reflectivity: 45%, thermal expansion coefficient: $46 \times 10^{-7}$/K Substrate B: alumina substrate (a polycrystalline substance having a composition of $Al_2O_3$: 96% by mass, $SiO_2$: 3% by mass and MgO: 1% by mass), thickness: 0.7 mm, reflectivity: 75%, thermal expansion coefficient: $71 \times 10^{-7}$/K Substrate C: alumina substrate (a polycrystalline substance having a composition of $Al_2O_3$: 96% by mass, $SiO_2$: 3% by mass and MgO: 1% by mass), thickness: 1.0 mm, reflectivity: 84%, thermal expansion coefficient: $71 \times 10^{-7}$/K Substrate D: alumina substrate (a polycrystalline substance having a composition of $Al_2O_3$: 96% by mass, $SiO_2$: 3% by mass and MgO: 1% by mass), thickness: 2.0 mm, reflectivity: 88%, thermal expansion coefficient: $71 \times 10^{-7}$/K Substrate E: zirconia-reinforced alumina substrate (a polycrystalline substance having a composition of $Al_2O_3$: 90% by mass and $ZrO_2$: 10% by mass), thickness: 0.3 mm, reflectivity: 80%, thermal expansion coefficient: $75 \times 10^{-7}$/K Substrate F: mullite substrate (a polycrystalline substance having a composition of $Al_6Si_2O_{13}$: more than 99% by mass), thickness: 0.7 mm, reflectivity: 80%, thermal expansion coefficient: $50 \times 10^{-7}$/K Substrate G: steatite substrate (a polycrystalline substance having a composition of $MgO+SiO_2$: more than 99% by mass), thickness: 0.7 mm, reflectivity: 72%, thermal expansion coefficient: $77 \times 10^{-7}$/K Substrate H: glass ceramic substrate (a polycrystalline substance having a composition of $Al_2O_3$: 20% by mass and borosilicate glass: 80% by mass), thickness: 0.7 mm, reflectivity: 43%, thermal expansion coefficient: $58 \times 10^{-7}$/K Substrate I: glass ceramic substrate (a polycrystalline substance having a composition of $Al_2O_3$: 50% by mass and borosilicate glass: 50% by mass), thickness: 0.7 mm, reflectivity: 71%, thermal expansion coefficient: $63 \times 10^{-7}$/K Substrate J: glass substrate (glass having a composition of $SiO_2$: 65% by mass, $B_2O_3$: 11% by mass, MgO: 1% by mass, CaO: 8% by mass and $Al_2O_3$: 15% by mass), thickness: 0.7 mm, reflectivity: 8%, thermal expansion coefficient: $38 \times 10^{-7}$/K Substrate K: silicon nitride substrate (a polycrystalline substance having a composition of $Si_3N_4$: more than 96% by mass) thickness: 0.7 mm, reflectivity: 18%, thermal expansion coefficient: $32 \times 10^{-7}$/K Substrate L: glass ceramic substrate (a polycrystalline substance having a composition of $Al_2O_3$: 80% by mass and borosilicate glass: 20% by mass), thickness: 0.7 mm, reflectivity: 73%, thermal expansion coefficient: $69 \times 10^{-7}$/K Substrate M: glass ceramic substrate (a polycrystalline substance having a composition of $Al_2O_3$: 80% by mass and bismuth silicate glass: 20% by mass), thickness: 0.7 mm, reflectivity: 75%, thermal expansion coefficient: $74 \times 10^{-7}$/K Substrate N: glass ceramic substrate (a polycrystalline substance having a composition of $Al_2O_3$: 80% by mass and bismuth silicate glass: 20% by mass), thickness: 0.3 mm, reflectivity: 67%, thermal expansion coefficient: $74 \times 10^{-7}$/K Substrate O: glass ceramic thin film (a polycrystalline substance having a composition of $Al_2O_3$: 80% by mass and bismuth silicate glass: 20% by mass), laminated glass ceramic substrate formed by laminating ten layers each having a thickness of 0.07 mm, thickness: 0.7 mm, reflectivity: 88%, thermal expansion coefficient: $74 \times 10^{-7}$/K (Raw Materials of Barrier Rib Photosensitive Paste)

Raw materials used for photosensitive pastes of examples are as follows.

Photosensitive monomer M-1: trimethylolpropane triacrylate

Photosensitive monomer M-2: tetrapropylene glycol dimethacrylate

Photosensitive monomer M-3: compound of the formula (A), wherein $R^1$ and $R^2$ are each an acryloyl group, $R^3$ is an ethylene oxide-propylene oxide cooligomer, $R^4$ is an isophorone di-isocyanate residue, and the molecular weight is 19,000:

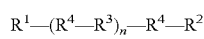

$$R^1-(R^4-R^3)_n-R^4-R^2 \quad\quad (A)$$

Photosensitive polymer: product of addition reaction of 0.4 equivalents of glycidyl methacrylate to carboxyl groups of a copolymer composed of methacrylic acid/methyl methacrylate/styrene in a mass ratio of 40/30/30 (weight average molecular weight: 43000, acid value: 100)

Photo-polymerization initiator: 2-benzyl-2-dimethylamino-1-(4-morpholinophenyl)butanone-1 (IC369 manufactured by BASF)

Polymerization Inhibitor:

1,6-hexanediol-bis [ (3,5-di-t-butyl-4-hydroxyphenyl) propionate]

Ultraviolet ray absorber solution: 0.3 mass % γ-butyrolactone solution of Sudan IV (manufactured by TOKYO OHKA KOGYO Co., Ltd.)

Solvent: γ-butyrolactone

Viscosity modifier: Flownon EC121 (manufactured by KYOEISHA CHEMICAL CO., LTD.)

Low-Melting-Point Glass Powder A:

28% by mass of $SiO_2$, 30% by mass of $B_2O_3$, 6% by mass of ZnO, 2% by mass of $Li_2O$, 3% by mass of MgO, 3% by mass of CaO, 3% by mass of BaO, 25% by mass of $Al_2O_3$, refractive index (ng): 1.551, softening temperature: 649° C., thermal expansion coefficient: $49 \times 10^{-7}$/K, 50% volume average particle diameter: 2.1 μm Low-Melting-Point Glass Powder B:

27% by mass of $SiO_2$, 31% by mass of $B_2O_3$, 6% by mass of ZnO, 7% by mass of $Li_2O$, 2% by mass of MgO, 2% by mass of CaO, 2% by mass of BaO, 23% by mass of $Al_2O_3$, refractive index (ng): 1.56, softening temperature: 588° C., thermal expansion coefficient: $68 \times 10^{-7}$/K, 50% volume average particle diameter: 2.3 μm Low-Melting-Point Glass Powder C:

28% by mass of $SiO_2$, 23% by mass of $B_2O_3$, 4% by mass of ZnO, 5% by mass of $Li_2O$, 15% by mass of $K_2O$, 4% by mass of MgO, 1% by mass of BaO, 20% by mass of $Al_2O_3$, refractive index (ng): 1.563, softening temperature: 540° C., thermal expansion coefficient: $86 \times 10^{-7}$/K, 50% volume average particle diameter: 2.2 μm High-Melting-Point Glass Powder:

30% by mass of $SiO_2$, 31% by mass of $B_2O_3$, 6% by mass of ZnO, 2% by mass of MgO, 2% by mass of CaO, 2% by mass of BaO, 27% by mass of $Al_2O_3$, refractive index (ng): 1.55, softening temperature: 790° C., thermal expansion coefficient: $32 \times 10^{-7}$/K, 50% volume average particle diameter: 2.3 μm (Preparation of Barrier Rib Paste)

A barrier rib paste was prepared by the following method using the materials described above.

Barrier Rib Photosensitive Paste A: 8 parts by mass of the photosensitive monomer M-1, 6 parts by mass of the photosensitive monomer M-2, 6 parts by mass of the photosensitive monomer M-3, 48 parts by mass of the photosensitive polymer, 12 parts by mass of the photo-polymerization initiator, 0.4 parts by mass of the polymerization inhibitor and 25.6 parts by mass of the ultraviolet ray absorber solution were dissolved in 76 parts by mass of the solvent under heating at a temperature of 80° C. After the obtained solution was cooled, 18 parts by mass of the viscosity modifier was added to prepare an organic solution 1. The refractive index (ng) of an organic coating film obtained by applying the organic solution 1 to a glass substrate and drying the applied solution was 1.555.

Next, to 150 parts by mass of the prepared organic solution 1 were added 80 parts by mass of the low-melting-point glass powder A and 20 parts by mass of the high-melting-point glass powder, followed by kneading the mixture by a three-roll kneader to prepare a barrier rib photosensitive paste A.

Barrier Rib Photosensitive Paste B: An organic solution 1 was prepared in the same manner as in preparation of the barrier rib photosensitive paste A. Next, to 150 parts by mass of the prepared organic solution 1 were added 90 parts by mass of the low-melting-point glass powder B and 10 parts by mass of the high-melting-point glass powder, followed by kneading the mixture by a three-roll kneader to prepare a barrier rib photosensitive paste B.

Barrier Rib Photosensitive Paste C: An organic solution 1 was prepared in the same manner as in preparation of the barrier rib photosensitive paste A. Next, to 150 parts by mass of the prepared organic solution 1 were added 80 parts by mass of the low-melting-point glass powder C and 20 parts by mass of the high-melting-point glass powder, followed by kneading the mixture by a three-roll kneader to prepare a barrier rib photosensitive paste C.

(Measurement of Light Emission Luminance)

The prepared scintillator panel was set in PaxScan2520 to prepare a radiation detector. X-rays at a tube voltage of 80 kVp were applied from the substrate side of the scintillator panel, and an amount of light emitted from a phosphor layer was detected. The luminance was evaluated by relative evaluation with the result of Example 1 taken as 100%.

Example 1

The barrier rib photosensitive paste A was applied to the substrate A by a die coater so as to have a dry thickness of 500 and dried to form a barrier rib photosensitive paste coating film. Next, the barrier rib photosensitive paste coating film was exposed at 600 mJ/cm$^2$ by an ultra-high pressure Mercury lamp through a photomask provided with an opening corresponding to a desired barrier rib pattern (chrome mask having a grid-like opening with both longitudinal and traverse pitches of 127 μm and a line width of 20 μm). The exposed barrier rib photosensitive paste coating film was developed in a 0.5% aqueous ethanolamine solution, so that an unexposed part was removed to form a grid-like photosensitive paste coating film pattern. Further, the photosensitive paste coating film pattern was fired in air at 585° C. for 15 minutes to obtain a barrier rib member having a grid-like barrier rib with a barrier rib pitch of 127 μm and a size of 125 mm×125 mm.

Thereafter, CsI:Tl (CsI:TlI=1 mol:0.003 mol), as a phosphor, was filled in spaces divided by the barrier rib, and firing was performed at 580° C. to prepare a scintillator panel 1 having a phosphor volume filling ratio of 85%. As a result of evaluating a radiation detector including the prepared scintillator panel 1 and PaxScan2520, proper images were obtained.

Example 2

Evaluation was performed in the same manner as in Example 1 except that the substrate B was used as a substrate, and the barrier rib photosensitive paste B was used as a barrier rib photosensitive paste. The relative light emission luminance was 115%, and proper images were obtained.

Example 3

Evaluation was performed in the same manner as in Example 1 except that the substrate C was used as a substrate, and the barrier rib photosensitive paste B was used as a barrier rib photosensitive paste. The relative light emission luminance was 120%, and proper images were obtained.

Example 4

Evaluation was performed in the same manner as in Example 1 except that the substrate D was used as a substrate, and the barrier rib photosensitive paste B was used as a barrier rib photosensitive paste. The relative light emission luminance was 100%, and proper images were obtained. The reason why the relative luminance was lower as compared to Example 3 although the reflectivity of the substrate was higher may be that as the thickness of the substrate increased, absorption of an X-ray by the substrate increased, so that the amount of light emitted from the phosphor decreased.

Example 5

Evaluation was performed in the same manner as in Example 1 except that the substrate E was used as a substrate, and the barrier rib photosensitive paste C was used as a barrier rib photosensitive paste. The relative light emission luminance was 115%, and proper images were obtained.

Example 6

Evaluation was performed in the same manner as in Example 1 except that the substrate F was used as a substrate. The relative light emission luminance was 120%, and proper images were obtained.

Example 7

Evaluation was performed in the same manner as in Example 1 except that the substrate G was used as a substrate, and the barrier rib photosensitive paste C was used as a barrier rib photosensitive paste. The relative light emission luminance was 110%, and proper images were obtained.

Example 8

Evaluation was performed in the same manner as in Example 1 except that the substrate H was used as a substrate, and the barrier rib photosensitive paste B was used as a barrier rib photosensitive paste. The relative light emission luminance was 100%, and proper images were obtained.

Example 9

Evaluation was performed in the same manner as in Example 1 except that the substrate I was used as a substrate, and the barrier rib photosensitive paste B was used as a barrier rib photosensitive paste. The relative light emission luminance was 110%, and proper images were obtained.

Example 10

Evaluation was performed in the same manner as in Example 1 except that the substrate L was used as a substrate, and the barrier rib photosensitive paste B was used as a barrier rib photosensitive paste. The relative light emission luminance was 113%, and proper images were obtained.

Example 11

Evaluation was performed in the same manner as in Example 1 except that the substrate M was used as a substrate, and the barrier rib photosensitive paste B was used as a barrier rib photosensitive paste. The relative light emission luminance was 115%, and proper images were obtained.

Example 11

Evaluation was performed in the same manner as in Example 1 except that the substrate N was used as a substrate, and the barrier rib photosensitive paste B was used as a barrier rib photosensitive paste. The relative light emission luminance was 115%, and proper images were obtained.

Example 12

Evaluation was performed in the same manner as in Example 1 except that the substrate O was used as a substrate, and the barrier rib photosensitive paste B was used as a barrier rib photosensitive paste. The relative light emission luminance was 125%, and proper images were obtained.

Comparative Example 1

Evaluation was performed in the same manner as in Example 1 except that the substrate J was used as a substrate. The relative light emission luminance was as low as 80%. Due to influences of a difference in thermal expansion coefficient between the substrate and the barrier rib, the substrate was warped, so that crosstalk of emitted light occurred, resulting in poor images.

Comparative Example 2

Evaluation was performed in the same manner as in Example 1 except that the substrate K was used as a substrate. The relative light emission luminance was as low as 90%. Due to influences of a difference in thermal expansion coefficient between the substrate and the barrier rib, the substrate was warped, so that crosstalk of emitted light occurred, resulting in poor images.

From the results described above, it is apparent that in examples according to the present invention, a radiation detector is obtained which has a high light emission luminance, and allows proper images to be obtained.

DESCRIPTION OF REFERENCE SIGNS

1: Radiation detector
2: Scintillator panel
3: Output substrate
4: Substrate
5: Buffer layer
6: Barrier rib
7: Scintillator layer
8: Diaphragm layer
9: Photoelectric conversion layer
10: Output layer
11: Substrate
12: Power supply portion

The invention claimed is:

1. A scintillator panel comprising: a plate-like substrate; a grid-like barrier rib provided on the substrate; and a scintillator layer containing a phosphor filled in cells divided by the barrier rib, wherein
   the barrier rib is formed of a material which is mainly composed of a low-melting-point glass, and
   the substrate is a polycrystalline substance produced by firing a raw material containing a fine powder of a ceramic selected from the group consisting of alumina, aluminum nitride, mullite and steatite,
   wherein the substrate has a reflectivity of light having a wavelength of 550 nm of 40% or more.

2. The scintillator panel according to claim 1, wherein the low-melting-point glass contains 2 to 20% by mass of an alkali metal oxide.

3. The scintillator panel according to claim 1, wherein the thickness of the substrate is 0.1 to 0.7 mm.

4. A method for manufacturing a scintillator panel comprising:
   forming a photosensitive paste coating film by applying onto a substrate a photosensitive paste containing a low-melting-point glass powder and a photosensitive organic component;
   exposing the obtained photosensitive paste coating film to light through a photomask having a predetermined opening;
   dissolving and removing a part of the exposed photosensitive paste coating film which is soluble in a developer to obtain a photosensitive paste coating film pattern;
   heating the photosensitive paste coating film pattern after development to 500 to 700° C. to remove the organic component and soften and sinter the low-melting-point glass and thereby forming a barrier rib; and
   filling a phosphor in cells divided by the barrier rib,
   wherein the scintillator panel comprises a plate-like substrate, a grid-like barrier rib provided on the substrate, and a scintillator layer containing a phosphor filled in cells divided by the barrier rib, and
   wherein the plate-like substrate is a polycrystalline substance produced by firing a raw material containing a fine powder of a ceramic selected from the group consisting of alumina, aluminum nitride, mullite, and steatite,
   wherein the substrate has a reflectivity of light having a wavelength of 550 nm of 40% or more.

* * * * *